United States Patent
Park

(10) Patent No.: US 7,466,608 B2
(45) Date of Patent: Dec. 16, 2008

(54) DATA INPUT/OUTPUT CIRCUIT HAVING DATA INVERSION DETERMINATION FUNCTION AND SEMICONDUCTOR MEMORY DEVICE HAVING THE SAME

(75) Inventor: Min Sang Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 11/528,799

(22) Filed: Sep. 28, 2006

(65) Prior Publication Data

US 2007/0103996 A1    May 10, 2007

(30) Foreign Application Priority Data

Nov. 8, 2005    (KR) .................. 10-2005-0106238

(51) Int. Cl.
*G11C 7/00* (2006.01)
*G11C 7/02* (2006.01)
*G06F 13/00* (2006.01)

(52) U.S. Cl. ............... 365/191; 365/206; 365/233.1; 710/58; 710/65; 710/100; 710/104; 710/110; 341/55; 341/144; 326/26; 327/310; 327/384

(58) Field of Classification Search ............. 365/191, 365/206, 233.1; 710/58, 65, 100, 104, 110; 341/55, 144; 326/26; 327/310, 384
See application file for complete search history.

(56) References Cited

U.S. PATENT DOCUMENTS

| | | | |
|---|---|---|---|
| 6,243,779 B1 * | 6/2001 | Devanney et al. | 710/305 |
| 6,992,506 B2 * | 1/2006 | Park et al. | 326/52 |
| 7,200,069 B2 * | 4/2007 | Jang et al. | 365/233.1 |
| 7,221,292 B2 * | 5/2007 | Hein | 341/55 |
| 7,406,608 B2 * | 7/2008 | Joshi | 713/300 |
| 7,408,482 B2 * | 8/2008 | Park et al. | 341/55 |
| 2003/0158981 A1 | 8/2003 | LaBerge | 710/100 |
| 2004/0065904 A1 * | 4/2004 | Yoshida et al. | 257/200 |
| 2004/0068594 A1 | 4/2004 | Asaro et al. | 710/104 |
| 2004/0205447 A1 * | 10/2004 | Park et al. | 714/823 |
| 2005/0132112 A1 | 6/2005 | Pawlowski | 710/110 |
| 2006/0049851 A1 * | 3/2006 | Park et al. | 326/112 |
| 2006/0215473 A1 * | 9/2006 | Dietrich | 365/220 |

FOREIGN PATENT DOCUMENTS

WO    WO 02/39290    5/2002

\* cited by examiner

*Primary Examiner*—J. H. Hur
*Assistant Examiner*—Eric Wendler
(74) *Attorney, Agent, or Firm*—Mills & Onello, LLP

(57) ABSTRACT

A data input/output circuit of a semiconductor memory device has a data inversion determination function. In an input mode, the data input/output circuit inverts an input data group in response to an input inversion flag and transmits the inverted input data group to a memory cell array. In an output mode, the data input/output circuit inverts a data group, output from the memory cell array, when the output data group satisfies a predetermined inversion condition, and transmits the inverted output data group to the outside of the data input/output circuit. In this case, an output inversion flag, indicating that the output data group is to be inverted, is generated. Further, the data input/output circuit stores the input inversion flag in the memory cell array in the input mode, and compares the input inversion flag, stored in the memory cell array, with the output inversion flag in the output mode. According to the data input/output circuit and the semiconductor memory device having the data input/output circuit, it can be readily determined whether a data inversion function is normally performed.

9 Claims, 8 Drawing Sheets

DATA INPUT/OUTPUT CIRCUIT HAVING DATA INVERSION DETERMINATION FUNCTION AND SEMICONDUCTOR MEMORY DEVICE HAVING THE SAME

RELATED APPLICATIONS

This application relies for priority on Korean Patent Application number 10-2005-106238, filed in the Korean Intellectual Property Office on Nov. 8, 2005, the contents of which are incorporated herein in their entirety by reference.

BACKGROUND OF THE INVENTION

1. Field of the Invention

The present invention relates, in general, to electronic circuitry for semiconductor devices and, more particularly, to a data input/output circuit with a data inversion function, and a semiconductor memory device having the data output/output circuit.

2. Description of the Related Art

The operating frequency of a semiconductor memory device continuously increases to improve operation speed. Moreover, in order to increase the number of data bits to be simultaneously input or output, the number of data input/output (I/O) pins (DQ) also increases. Recently, an ultra-high-speed semiconductor memory device that is operated at a frequency of 500 MHz or higher and has 32 data I/O pins (DQ), has been popularized.

In such a system, when 32 DQ pins are simultaneously operated, considerable noise is induced in output data, which is typically designated as "simultaneous switching noise" (hereinafter referred to as "SSN"). If the SSN is high, the waveform of output data is damaged, thus degrading signal integrity. In this case, it is difficult for the semiconductor memory device to satisfy the input/output performance required by a high-frequency system. In order to reduce the SSN, a semiconductor memory device adopts a data input/output circuit having a data inversion function.

In a data input/output circuit having a data inversion function, the number of toggled bits of a data group to be currently output is compared to that of a previously output data group. Depending on the number of toggled bits, data is output being inverted or non-inverted. In detail, if the number of toggled bits is higher than one half of the bits, bits belonging to the data group are output being inverted. Further, an output flag, indicating that the output data group has been inverted, is additionally output. If the number of toggled bits is equal to or lower than one half of the bits, bits belonging to the data group are output being non-inverted, and an output flag indicates that a data group has been output without being inverted.

As described above, the data input/output circuit having a data inversion function can consistently maintain the number of toggled bits at one half or below, thus decreasing switching noise of an output data group. As a result, since the signal integrity of the output data group is improved, the semiconductor memory device has better input/output performance.

FIG. 1 is a diagram showing a conventional data input/output circuit having a data inversion function, and a semiconductor memory device having the data input/output circuit. A first data input/output circuit 11 inverts a data group, input through first external data lines DQ1<1:8>, in response to a first input inversion flag IVF1, and provides the inverted data group to a first memory block 21. Further, the first data input/output circuit 11 determines whether a data group, output from the first memory block 21, has been inverted, and provides the output data group to the first external data lines DQ1<1:8>. In this case, a first output flag OVF1, indicating whether the output data group has been inverted, is output.

Similar to this, a second data input/output circuit 13 inverts a data group, input through second external data lines DQ2<1:8>, in response to a second input inversion flag IVF2, and provides the inverted data group to a second memory block 23. Further, the second data input/output circuit 13 determines whether the data group, output from the second memory block 23, has been inverted, and provides the output data group to the second external data lines DQ2<1:8>. In this case, a second output flag OVF2, indicating whether the output data group has been inverted, is output.

However, in the conventional semiconductor memory device, a correlation does not exist between the input inversion flags IVF1 and IVF2 and the output flags OVF1 and OVF2. Therefore, the conventional semiconductor memory device is problematic in that separate test devices are required to determine whether a data input/output circuit normally performs a data inversion function.

SUMMARY OF THE INVENTION

Accordingly, the present invention has been made keeping in mind the above problems occurring in the prior art, and a feature of the present invention is to provide a semiconductor memory device, which can readily determine whether a data inversion function is normally performed during a data input/output operation, and a data input/output circuit included in the semiconductor memory device.

In accordance with one aspect of the present invention, there is provided a semiconductor memory device. The semiconductor memory device of the present invention comprises a memory cell array; and a data input/output circuit for, in an input mode, inverting an input data group in response to an input inversion flag and transmitting the inverted input data group to the memory cell array, and for, in an output mode, inverting an output data group when the data group, output from the memory cell array, satisfies a predetermined inversion condition, outputting an inverted output data group out of the semiconductor memory device, and generating an output inversion flag indicating that the output data group is to be inverted. The data input/output circuit stores the input inversion flag in the memory cell array in the input mode, and compares the input inversion flag, stored in the memory cell array, with the output inversion flag in the output mode.

In one embodiment, the data input/output circuit comprises: a data inversion unit for inverting the input data group in response to the input inversion flag in the input mode, and generating the output inversion flag and inverting the output data group in response to the output inversion flag in the output mode; and a flag comparison unit for comparing the input inversion flag with the output inversion flag.

In one embodiment, the flag comparison unit comprises: an exclusive OR gate for performing an exclusive OR operation on the input inversion flag and the output inversion flag; a first NMOS transistor gated to generate an output signal of the exclusive OR gate as an inversion determination signal; and a second NMOS transistor gated to generate the output inversion flag as the inversion determination signal.

In accordance with another aspect of the present invention, there is provided another semiconductor memory device, comprising: a memory cell array including first and second memory blocks; and first and second data input/output circuits, each operated, in an input mode, to invert an input data group in response to a corresponding input inversion flag and to transmit the inverted input data group to a corresponding memory block, each operated, in an output mode, to invert a data group, output from a corresponding memory block, when the output data group satisfies a predetermined inversion condition, to transmit the inverted output data group out of the semiconductor memory device, and to generate an output inversion flag, indicating that the output data group is to be inverted. Each of the first and second data input/output circuits is driven, in the input mode, to store the input inversion flag thereof in a memory block that does not correspond to the data input/output circuit so as to determine whether a data inversion function is normally performed, and is driven, in the output mode, to compare the input inversion flag with the output inversion flag.

In one embodiment, each of the first and second data input/output circuits comprises: a data inversion unit for inverting the input data group in response to the input inversion flag in the input mode, and generating the output inversion flag and inverting the output data group in response to the output inversion flag in the output mode; and a flag comparison unit for comparing the input inversion flag with the output inversion flag.

In one embodiment, the data inversion unit comprises: input data inversion means for inverting the input data group in response to the input inversion flag and providing the inverted input data group to a memory block corresponding to the data inversion unit, the input data inversion means providing an input inversion flag of a remaining data input/output circuit, which does not correspond to the data inversion unit, to the memory block corresponding to the data inversion unit in a predetermined test mode; inversion determination means for determining whether the output data group satisfies the inversion condition and then generating the output inversion flag; and output data inversion means for inverting and outputting the output data group in response to the output inversion flag, the output data inversion means providing the input inversion flag of the remaining data input/output circuit, which is provided from the memory block corresponding to the data inversion unit, to the remaining data input/output circuit in the test mode.

In one embodiment, the flag comparison unit comprises: an exclusive OR gate for performing an exclusive OR operation on the input inversion flag and the output inversion flag; a first NMOS transistor gated to generate an output signal of the exclusive OR gate as an inversion determination signal; and a second NMOS transistor gated to generate the output inversion flag as the inversion determination signal.

In accordance with another aspect of the present invention, there is provided a data input/output circuit. The data input/output circuit of the present invention comprises a data inversion unit for inverting an input data group in response to a first input inversion flag, determining whether to invert an output data group, generating an output inversion flag, and inverting the output data group in response to the output inversion flag; and a flag comparison unit for comparing the output inversion flag with the first input inversion flag.

In one embodiment, the data inversion unit comprises: input data inversion means for inverting and transmitting the input data group in response to the first input inversion flag, the input data inversion means transmitting a second input inversion flag in a predetermined test mode; inversion determination means for determining whether the output data group satisfies an inversion condition and then generating the output inversion flag; and output data inversion means for inverting and outputting the output data group in response to the output inversion flag, the output data inversion means transmitting the second input inversion flag in the test mode.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE PREFERRED EMBODIMENTS

Figure 1:
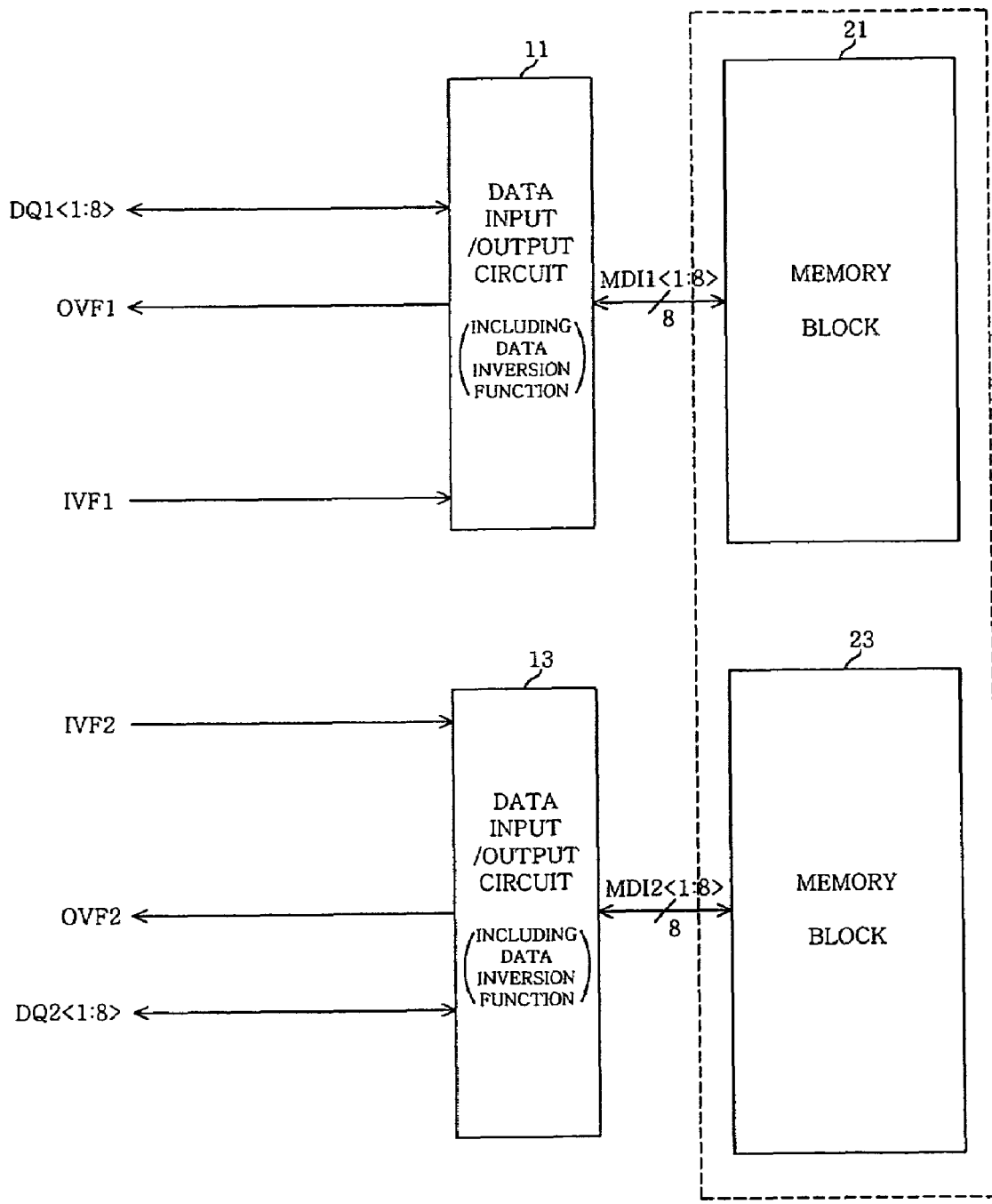
FIG. 1 is a diagram showing a conventional data input/output circuit having a data inversion function, and a semiconductor memory device having the data input/output circuit.
Figure 2:
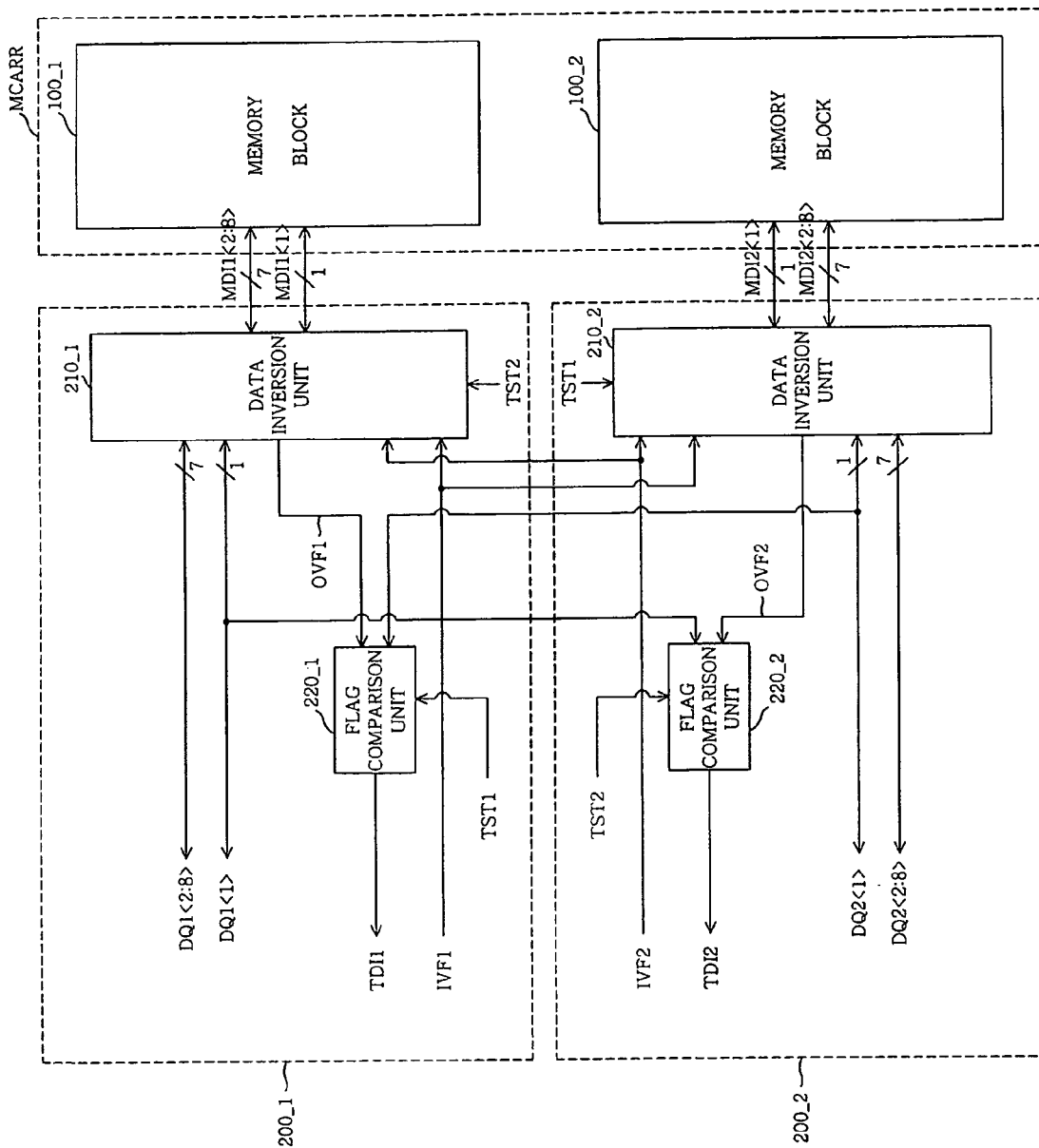
FIG. 2 is a diagram schematically showing a data input/output circuit having a data inversion function, and a semiconductor memory device having the data input/output circuit according to an embodiment of the present invention.

FIG. 2 is a diagram schematically showing a data input/output circuit having a data inversion function, and a semiconductor memory device having the data input/output circuit according to an embodiment of the present invention. The semiconductor memory device of the present invention includes a memory cell array MCARR and a plurality of data input/output circuits. The memory cell array MCARR is preferably divided into a plurality of memory blocks corresponding to the data input/output circuits.

In FIG. 2, two memory blocks 100_1 and 100_2 in the memory cell array MCARR, and two data input/output circuits 200_1 and 200_2, are representatively shown. However, this is only an illustrative embodiment, and the scope of the present invention is not limited to any particular number of memory blocks or data input/output circuits.

In the present specification, the upper data input/output circuit 200_1 corresponds to the upper memory block 100_1, and the lower data input/output circuit 200_2 corresponds to the lower memory block 100_2.

Each of the data input/output circuits 200_i (i=1 and 2) transmits an input data group to a corresponding memory block 100_i in an input mode. In this case, the input data group is inverted in response to a corresponding input inversion flag IVFi.

In the semiconductor memory device of the present invention, the input inversion flag IVFi is stored in the memory cell array MCARR in the input mode. In more detail, the input inversion flag IVFi is stored in a memory block 100_j (j=1 and 2, j≠i) other than the memory block 100_i corresponding to the input inversion flag IVFi.

For example, the input inversion flag IVF1 of the upper data input/output circuit 200_1 is stored in the lower memory block 100_2 through the lower data inversion unit 210_2 and a single internal data line MDI2<1>.

Similar to this, the input inversion flag IVF2 of the lower data input/output circuit 200_2 is stored in the upper memory block 100_1 through the upper data inversion unit 210_1 and a single internal data line MDI1<1>.

Further, each of the data input/output circuits 200_i transmits a data group, output from the corresponding memory block 100_i, to the outside of the semiconductor memory device in the output mode. In this case, each of the data input/output circuits 200_i determines whether an output data group satisfies a predetermined inversion condition, and generates an output inversion flag OVFi based on the determination results. The output data group is inverted and transmitted to the outside of the semiconductor memory device in response to the output inversion flag OVFi. Further, each of the data input/output circuits 200_1 generates the output inversion flag OVFi indicating whether to invert the output data group.

Further, in the test mode, the output inversion flag OVFi is compared to its input inversion flag IVFi stored in a memory block 100_i that does not correspond thereto, and the comparison results are generated as an inversion determination signal TDIi. In the present invention, it can be determined whether the data input/output circuit 200_i normally performs the inversion of the output data group RDQi, based on the logic state of the inversion determination signal TDIi.

In this embodiment, when the data input/output circuit 200_i normally performs a data inversion function, the logic state of the inversion determination signal TDIi makes a transition to a logic L state. Further, when the data input/output circuit 200_i does not normally perform a data inversion function, the logic state of the inversion determination signal TDIi makes a transition to a logic H state. This operation is described in detail below.

In FIG. 2, reference DQi<1:8> denotes data lines that are required to transmit an input/output data group and are external data lines connected to data input/output pads. Reference numeral MDIi<1:8> denotes data lines that are required to transmit an input/output data group and are internal data lines between the data input/output circuit 200_i and the memory block 100_i.

In the present specification, "i" is used to identify data input/output circuits and memory blocks. Further, numerals in angle brackets <> are used to identify data that are input or output in parallel. In the present specification, it can be seen that 8 data bits can be simultaneously input to or output from each block. However, this structure is only an exemplary embodiment, and the number of data bits that are input or output in parallel through each data input/output circuit can be different.

In this embodiment, the upper data input/output circuit 200_1 and the lower data input/output circuit 200_2 have the same construction and operation. Therefore, in the present specification, for convenience of description, the upper data input/output circuit 200_1 is described.

Referring to FIG. 2, the data input/output circuit 200_1 includes a data inversion unit 210_1 and a flag comparison unit 220_1. In the input mode, the data inversion unit 210_1 receives a data group input through the external data lines DQi<1:8> (refer to A1 of FIG. 3A). Further, the data inversion unit 210_1 inverts the input data group in response to the input inversion flag IVF1, and provides the inverted data group to the internal data lines MDI1<1:8>. Further, the input data group, provided to the internal data lines MDI1<1:8>, is stored in the first memory block 100_1 (refer to A2 of FIG. 3A).

Figure 3A:
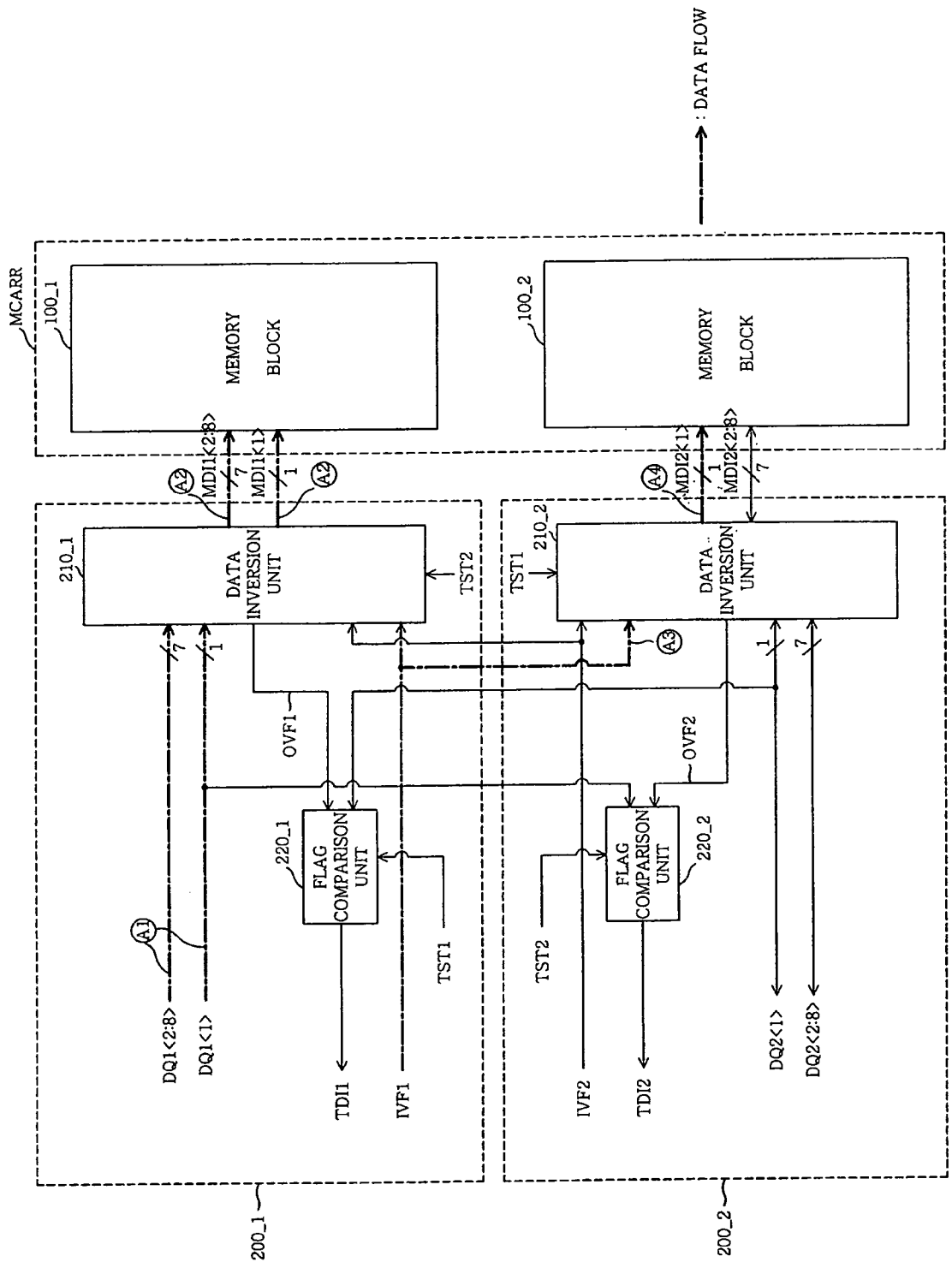
FIG. 3A is a diagram showing input inversion flags and a data flow during an input operation in the test mode of the semiconductor memory device of FIG. 2.

Further, during an input operation in a test mode for testing the data inversion function of the upper data input/output circuit 200_1, the input inversion flag IVF1 is provided to the data inversion unit 210_2 of the lower data input/output circuit 200_2 (refer to A3 of FIG. 3A). Further, the data inversion unit 210_2 of the lower data input/output circuit 200_2 does not invert the input inversion flag IVF1 and transmits the input inversion flag IVF1 to the internal data line MDI2<1>. Then, the input inversion flag IVF1, transmitted to the internal data line MDI2<1>, is stored in the lower memory block 100_2 (refer to A4 of FIG. 3A).

Figure 3B:
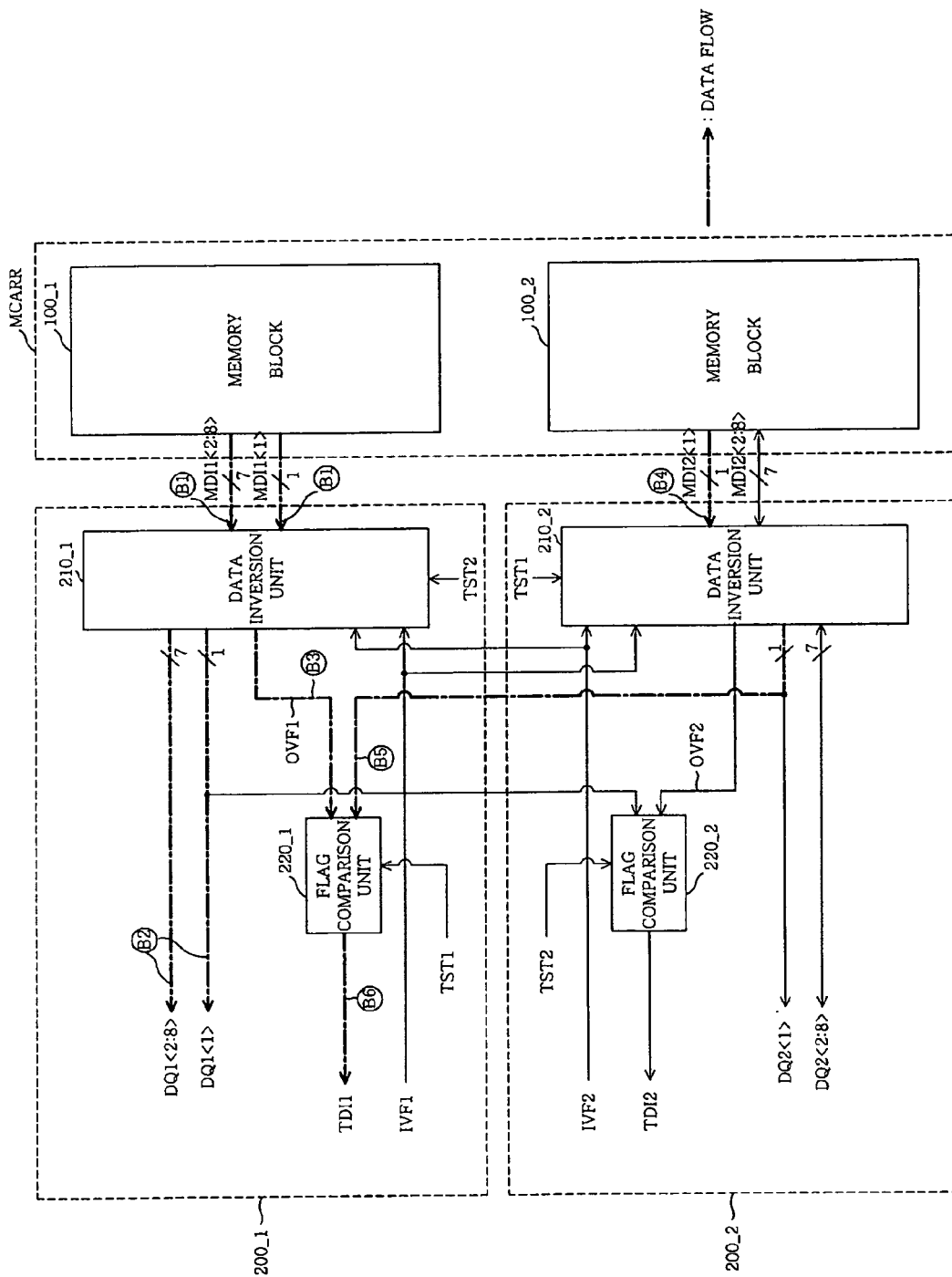
FIG. 3B is a diagram showing the input inversion flags and a data flow during an output operation in the test mode of the semiconductor memory device of FIG. 2.

Further, in the output mode, the data inversion unit 210_1 receives data, stored in the memory block 100_1, through the internal data lines MDI1<1:8> (refer to B1 of FIG. 3B). Further, when an output data group satisfies a predetermined inversion condition, the data inversion unit 210_1 inverts the output data group and transmits the inverted output data group to the external data lines DQ1<1:8> (refer to B2 of FIG. 3B). In this case, an output inversion flag OVF1, indicating that the output data group is to be inverted, is generated (refer to B3 of FIG. 3B).

During an output operation in the test mode for testing the data inversion function of the upper data input/output circuit 200_1, the input inversion flag IVF1, stored in the lower memory block 100_2, is provided to the lower data inversion unit 210_2 through the internal data line MDI2<1> (refer to B4 of FIG. 3B). Further, the data inversion unit 210_2 does not invert the upper input inversion flag IVF1, provided through the internal data line MDI2<1>, and provides the input inversion flag IVF1 to the flag comparison unit 220_1 of the upper data input/output circuit 200_1 (refer to B5 of FIG. 3B). In this case, part of the external data line DQ2<1> can be used.

Further, the flag comparison unit 220_2 compares the output inversion flag OVF1, provided from the upper data inversion unit 210_1, with the input inversion flag IVF1, provided from the lower data inversion unit 210_2, and then generates the inversion determination signal TDI1 (refer to B6 of FIG. 3B). It can be determined whether the data inversion function of the data input/output circuit 200_1 is normally performed, based on the logic state of the inversion determination signal TDI1.

Next, the data inversion unit 210_1 is described in detail.

Figure 4:
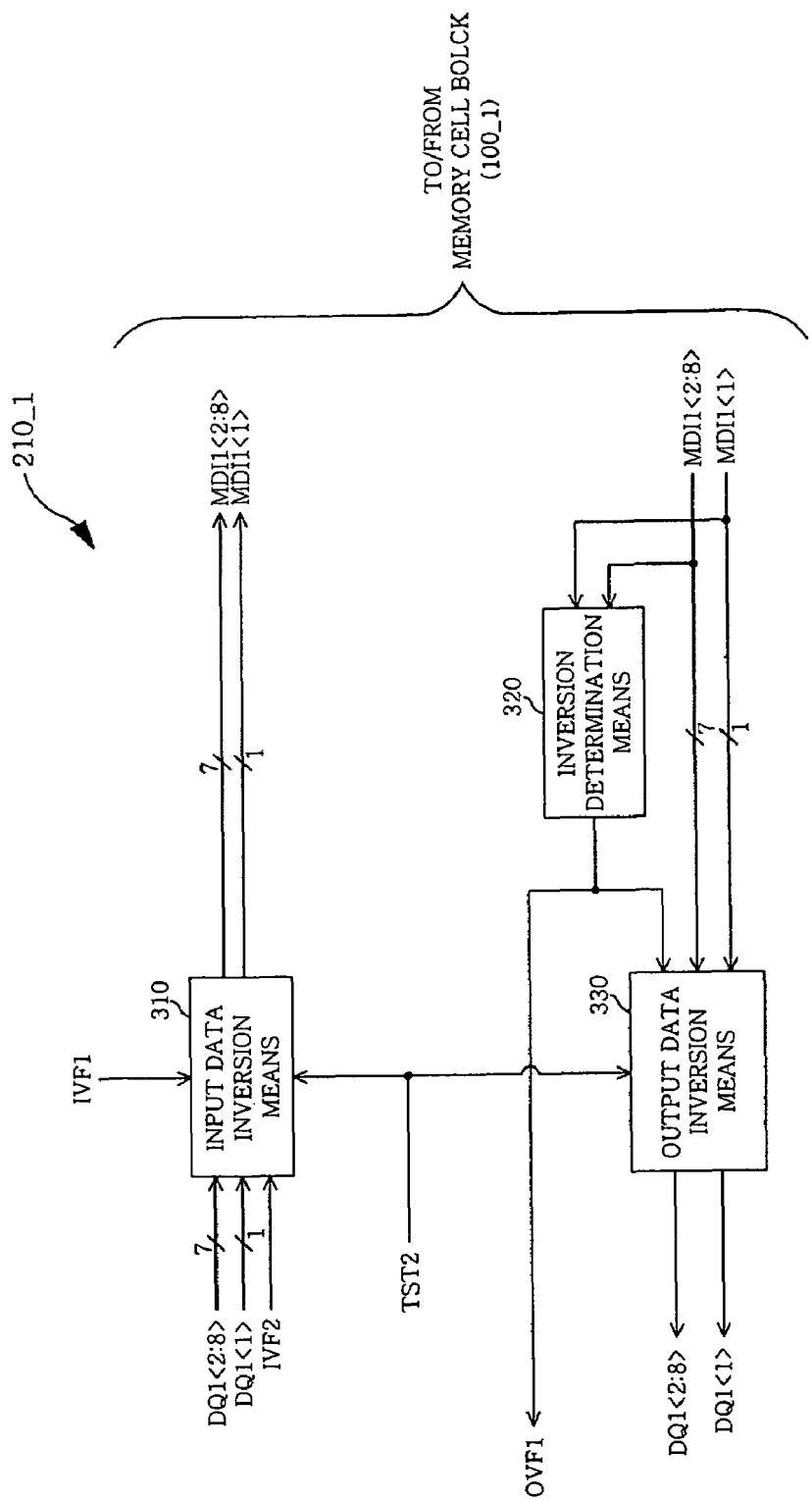
FIG. 4 is a diagram showing the data inversion unit of FIG. 2 in detail.

FIG. 4 is a diagram showing the data inversion unit 210_1 of FIG. 2 in detail. Referring to FIG. 4, the data inversion unit 210_1 includes an input data inversion means 310, an inversion determination means 320 and an output data inversion means 330.

The input data inversion means 310 inverts an input data group on the external data lines DQ1<1:8> in response to the first input inversion flag IVF1, and provides the inverted input data group to the internal data lines MDI1<1:8>. Further, the input data inversion means 310 does not invert the second input inversion flag IVF2 in response to a second test mode signal TST2, and provides the second input inversion flag to the first memory block 100_1. The second input inversion flag IVF2 is provided to the memory block 100_1 through the internal data line MDI1<1>. In this case, the second test mode signal TST2 is activated in a test mode for testing the data inversion function of the lower data input/output circuit 200_2.

Figure 5:
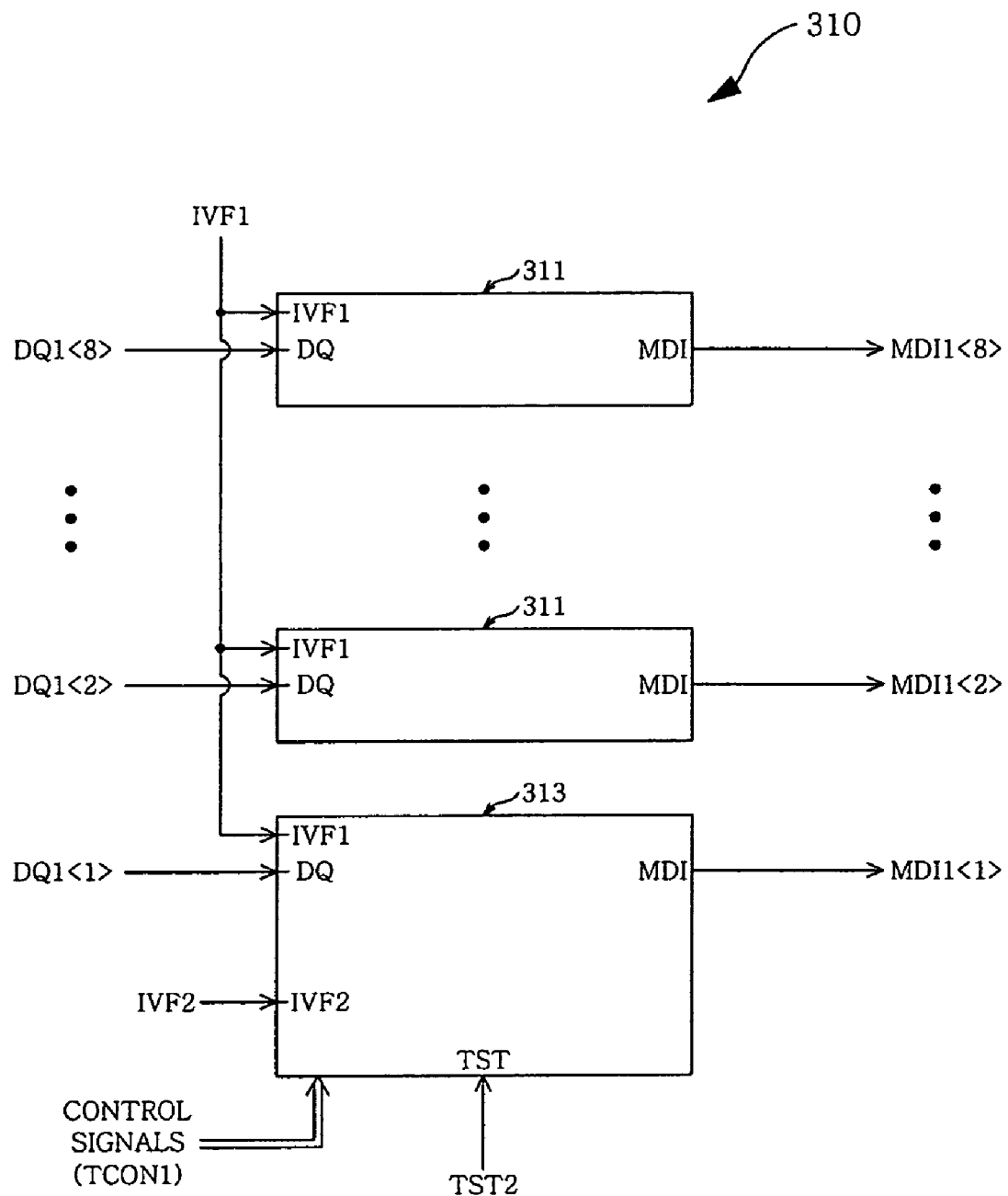
FIG. 5 is a diagram showing the input data inversion means of FIG. 4 in detail.

FIG. 5 is a diagram showing the input data inversion means 310 of FIG. 4 in detail. Referring to FIG. 5, the input data inversion means 310 includes, in one particular embodiment, seven inversion units 311 and a selective inversion unit 313. The seven inversion units invert a data group, input through corresponding external data lines DQ1<2:8>, in response to the input inversion flag IVF1, and provides the inverted data group to the internal data lines MDI1<2:8>.

During a typical input operation (when the second test mode signal TST2 is inactivated), the selective inversion unit 313 inverts data, input through the corresponding external data line DQ1<1>, in response to the input inversion flag IVF1, and provides the inverted data to the internal data line MDI1<1>, similar to the inversion units 311.

However, during an input operation in the test mode (when the second test mode signal TST2 is activated and suitable control signals TCON1 are activated), the selective inversion unit 313 does not invert the second input inversion flag IVF2 and provides the second input inversion flag to the internal data line MDI1<1>. In this case, the control signals TCON1 are required to control the input operation of the semiconductor memory device according to the present invention.

Referring to FIG. 4 again, the inversion determination means 320 determines whether a data group, output through the internal data lines MDI1<1:8>, satisfies a predetermined inversion condition. In this case, the inversion determination means 320 generates the output inversion output inversion flag OVF1, indicating whether to invert the output data group.

Further, the output data inversion means 330 inverts data, output through the internal data lines MDI1<1:8>, in response to the output inversion flag OVF1, and provides the inverted data to the external data lines DQ<1:8>. Further, the output data inversion means 330 does not invert the data on the internal data line MDI1<1> (that is, the lower input inversion flag IVF2) in response to the second test mode signal TST2, and provides the data to the external data line DQ1<1>.

Figure 6:
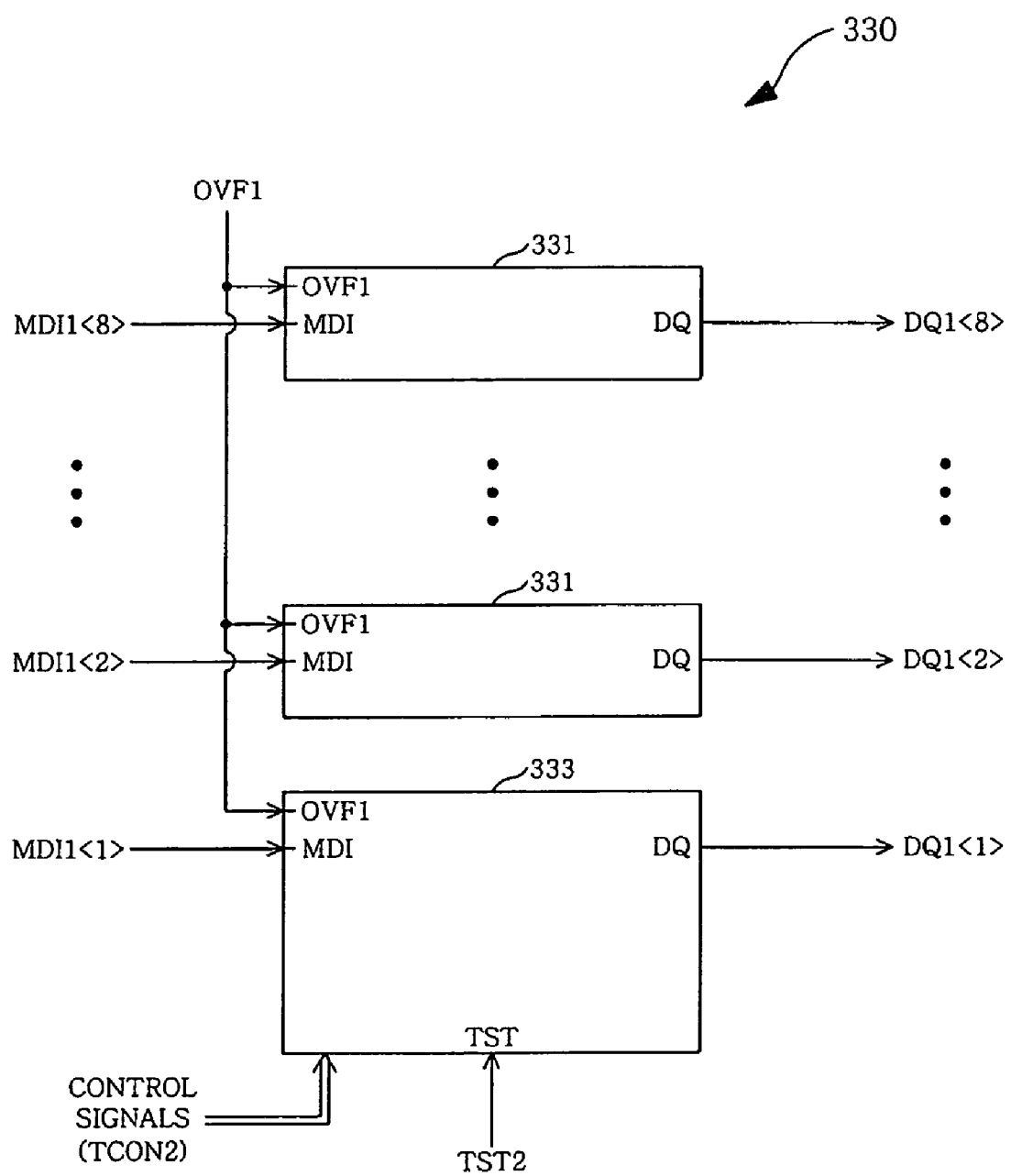
FIG. 6 is a diagram showing the output data inversion means of FIG. 4 in detail.

FIG. 6 is a diagram showing the output data inversion means 330 of FIG. 4 in detail. Referring to FIG. 6, the output data inversion means 330 includes, in one particular embodiment, seven inversion units 331 and a selective inversion unit 333, similar to the input data inversion means 310. The seven inversion units invert a data group, output through corresponding internal data lines MDI1<2:8>, in response to the output inversion flag OVF1, and provides the inverted data group to the external data lines DQ1<2:8>.

During a typical output operation (when the second test mode signal TST2 is inactivated), the selective inversion unit 333 inverts data, input through the corresponding internal data line MDI1<1>, in response to the output inversion flag OVF1, and provides the inverted data to the external data line DQ1<1>, similar to the inversion units 331.

However, during an output operation in the test mode (when the second test mode signal TST2 is activated and suitable control signals TCON2 are activated), the selective inversion unit 333 does not invert data on the internal data line MDI1<1> (that is, the second input inversion flag IVF2), and provides the data to the external data line DQ1<1>. In this case, the control signals TCON2 are required to control the output operation of the semiconductor memory device according to the present invention.

Next, the flag comparison unit 220_1 of FIG. 2 is described in detail.

Figure 7:
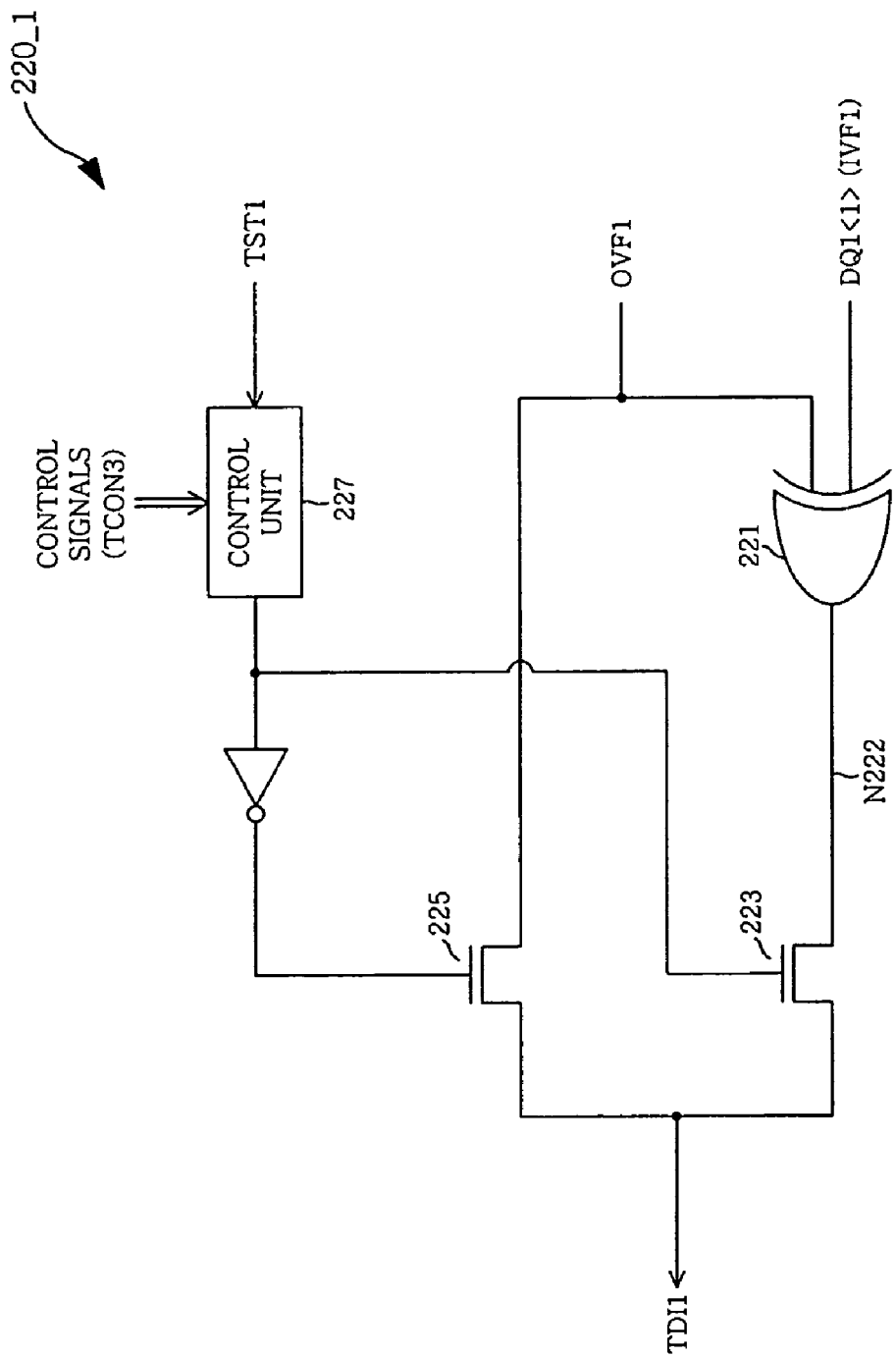
FIG. 7 is a diagram showing the flag comparison unit of FIG. 2 in detail.

FIG. 7 is a diagram showing the flag comparison unit 220_1 in detail. The flag comparison unit 220_1 includes an exclusive OR gate 221 and first and second NMOS transistors 223 and 225.

The exclusive OR gate 221 performs an exclusive OR operation on the data of the external data line MDI2<1> (consequently, the input inversion flag IVF1) and the output inversion flag OVF1.

During the output operation in the test mode (that is, when a first test mode signal TST1 and suitable control signals TCON3 are activated), the first NMOS transistor 223 is gated to generate the output signal N222 of the exclusive OR gate 221 as the inversion determination signal TDI1. In this case, the control signals TCON3 are required to control a data inversion determination operation in the output operation of the semiconductor memory device according to the present invention.

Therefore, when the logic state of the output inversion flag OVF1 is identical to that of the input inversion flag IVF1, the inversion determination signal TDI1 makes a transition to a logic L state. In this way, the inversion determination signal TDI1 in a logic L state indicates that the data input/output circuit 200_1 normally performs a data inversion function.

When the logic state of the output inversion flag OVF1 is different from that of the input inversion flag IVF1, the logic state of the inversion determination signal TDI1 makes a transition to a logic H state. In this way, the inversion determination signal TDI1 in a logic H state indicates that the data input/output circuit 200_1 does not normally perform a data inversion function.

Therefore, it can be determined whether a data inversion function is normally performed, by only checking the logic state of the inversion determination signal TDI1.

The control unit 227 of FIG. 7 generates a signal for gating the first and second NMOS transistors 223 and 225 in response to the first test mode signal TST1 and suitable control signals.

During an output operation in a normal mode (that is, when the first test mode signal TST1 is inactivated), the second NMOS transistor 225 is gated to generate the output inversion flag OVF1 as the inversion determination signal TDI1. In this case, the inversion determination signal TDI1 has the same logic state as the output inversion flag OVF1.

Therefore, in the normal output operation, the inversion determination signal TDI1 can be used instead of the output inversion flag OVF1.

In the data input/output circuit and the semiconductor memory device having the data input/output circuit, the input inversion flag is stored in a memory block during a data input operation, whereas the output inversion flag is compared to the stored input inversion flag during a data output operation. Further, the comparison results are shown as the logic state of the inversion determination signal. Therefore, it can be determined whether a data inversion function is normally performed by checking the logic state of the inversion determination signal TDIi.

Accordingly, the data input/output circuit and the semiconductor memory device having the data input/output circuit according to the present invention can easily determine whether a data inversion function is normally performed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

For example, in the present specification, an embodiment, in which all data input/output circuits can determine whether a data inversion function is normally performed, is shown and described. However, the present invention is also applicable to an embodiment in which any one of a plurality of data input/output circuits has a flag comparison unit and performs a data inversion function.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device, comprising:
a memory cell array; and
a data input/output circuit for, in an input mode, inverting an input data group in response to an input inversion flag and transmitting the inverted input data group to the memory cell array, and for, in an output mode, inverting an output data group when the data group, output from the memory cell array, satisfies a predetermined inversion condition, outputting an inverted output data group out of the semiconductor memory device, and generating an output inversion flag indicating that the output data group is to be inverted,
wherein the data input/output circuit stores the input inversion flag in the memory cell array in the input mode, and compares the input inversion flag, stored in the memory cell array, with the output inversion flag in the output mode.

2. The semiconductor memory device according to claim 1, wherein the data input/output circuit comprises:
a data inversion unit for inverting the input data group in response to the input inversion flag in the input mode, and generating the output inversion flag and inverting the output data group in response to the output inversion flag in the output mode; and
a flag comparison unit for comparing the input inversion flag with the output inversion flag.

3. The semiconductor memory device according to claim 2, wherein the flag comparison unit comprises:
an exclusive OR gate for performing an exclusive OR operation on the input inversion flag and the output inversion flag;
a first NMOS transistor gated to generate an output signal of the exclusive OR gate as an inversion determination signal; and
a second NMOS transistor gated to generate the output inversion flag as the inversion determination signal.

4. A semiconductor memory device, comprising:
a memory cell array including first and second memory blocks; and
first and second data input/output circuits, each operated, in an input mode, to invert an input data group in response to a corresponding input inversion flag and to transmit the inverted input data group to a corresponding memory block, each operated, in an output mode, to invert a data group, output from a corresponding memory block, when the output data group satisfies a predetermined inversion condition, to transmit the inverted output data group out of the semiconductor memory device, and to generate an output inversion flag, indicating that the output data group is to be inverted;
wherein each of the first and second data input/output circuits is driven, in the input mode, to store the input inversion flag thereof in a memory block that does not correspond to the data input/output circuit so as to determine whether a data inversion function is normally performed, and is driven, in the output mode, to compare the input inversion flag with the output inversion flag.

5. The semiconductor memory device according to claim 4, wherein each of the first and second data input/output circuits comprises:
a data inversion unit for inverting the input data group in response to the input inversion flag in the input mode, and generating the output inversion flag and inverting the output data group in response to the output inversion flag in the output mode; and
a flag comparison unit for comparing the input inversion flag with the output inversion flag.

6. The semiconductor memory device according to claim 5, wherein the data inversion unit comprises:
input data inversion means for inverting the input data group in response to the input inversion flag and providing the inverted input data group to a memory block corresponding to the data inversion unit, the input data inversion means providing an input inversion flag of a remaining data input/output circuit, which does not correspond to the data inversion unit, to the memory block corresponding to the data inversion unit in a predetermined test mode;
inversion determination means for determining whether the output data group satisfies the inversion condition and then generating the output inversion flag; and
output data inversion means for inverting and outputting the output data group in response to the output inversion flag, the output data inversion means providing the input inversion flag of the remaining data input/output circuit, which is provided from the memory block corresponding to the data inversion unit, to the remaining data input/output circuit in the test mode.

7. The semiconductor memory device according to claim 5, wherein the flag comparison unit comprises:
an exclusive OR gate for performing an exclusive OR operation on the input inversion flag and the output inversion flag;
a first NMOS transistor gated to generate an output signal of the exclusive OR gate as an inversion determination signal; and
a second NMOS transistor gated to generate the output inversion flag as the inversion determination signal.

8. A data input/output circuit, comprising:
a data inversion unit for inverting an input data group in response to a first input inversion flag, determining whether to invert an output data group, generating an output inversion flag, and inverting the output data group in response to the output inversion flag; and
a flag comparison unit for comparing the output inversion flag with the first input inversion flag.

9. The data input/output circuit according to claim 8, wherein the data inversion unit comprises:
input data inversion means for inverting and transmitting the input data group in response to the first input inversion flag, the input data inversion means transmitting a second input inversion flag in a predetermined test mode;
inversion determination means for determining whether the output data group satisfies an inversion condition and then generating the output inversion flag; and
output data inversion means for inverting and outputting the output data group in response to the output inversion flag, the output data inversion means transmitting the second input inversion flag in the test mode.

* * * * *